US012609511B2

(12) United States Patent
Iwamoto et al.

(10) Patent No.:     US 12,609,511 B2
(45) Date of Patent:       Apr. 21, 2026

(54) SEMICONDUCTOR OPTICAL INTEGRATED DEVICE

(71) Applicant: Lumentum Japan, Inc., Sagamihara (JP)

(72) Inventors: Koichiro Iwamoto, Tokyo (JP); Shunya Yamauchi, Kanagawa (JP)

(73) Assignee: Lumentum Radiant GmbH, Baar (CH)

( * ) Notice: Subject to any disclaimer, the term of this patent is extended or adjusted under 35 U.S.C. 154(b) by 876 days.

(21) Appl. No.: 17/655,508

(22) Filed: Mar. 18, 2022

(65) Prior Publication Data

US 2023/0117332 A1      Apr. 20, 2023

(30) Foreign Application Priority Data

Oct. 14, 2021    (JP) ................................. 2021-168922
Dec. 6, 2021    (JP) ................................. 2021-197845

(51) Int. Cl.
   *H01S 5/227*       (2006.01)
   *H01S 5/042*       (2006.01)

(52) U.S. Cl.
   CPC .......... *H01S 5/227* (2013.01); *H01S 5/04254*
      (2019.08); *H01S 5/04256* (2019.08)

(58) Field of Classification Search
   CPC ....................................................... H01S 5/227
   See application file for complete search history.

(56) References Cited

U.S. PATENT DOCUMENTS 5,084,894 A * 1/1992 Yamamoto ................ H01S 5/12
                                                              372/50.22
5,481,559 A    1/1996 Kawamura
                (Continued)

FOREIGN PATENT DOCUMENTS

CN          101222121 A       7/2008
EP           4210185 A1 *    7/2023    ........... H01S 5/0234
                (Continued)

OTHER PUBLICATIONS

Daunt, C. L. M. et al., "Compact Electro Absorption Modulators for Photonic Integrated Circuits, Using an Isolated Pedestal Contact Scheme", IEEE Photonics Technology Letters, Mar. 3, 2012, vol. 24(5), pp. 356-358.

*Primary Examiner* — Minsun O Harvey
*Assistant Examiner* — Stephen Sutton Kotter
(74) *Attorney, Agent, or Firm* — Harrity & Harrity, LLP

(57)       ABSTRACT

A device includes: a mesa stripe structure comprising a semiconductor in a stripe shape extending in a first direction, with first and second portions spaced apart in the first direction, and a third portion between the first and second portions; and an electrode pattern including a first electrode overlapping with the first portion but not overlapping with the second portion, and a second electrode overlapping with the second portion but not overlapping with the first portion. The first and second electrodes are separated. The electrode pattern comprises a metal in a shape of not overlapping with the third portion. The electrode pattern includes an adjacent area not overlapping with the mesa stripe structure. The adjacent area is next to the third portion in a second direction orthogonal to the first direction, and is on a semiconductor layer continuous to the mesa stripe structure.

20 Claims, 18 Drawing Sheets

(56)                    References Cited

U.S. PATENT DOCUMENTS

| | | | | |
|---|---|---|---|---|
| 5,683,937 A | * | 11/1997 | Furukawa | B82Y 20/00 |
| | | | | 438/42 |
| 8,462,599 B2 | | 6/2013 | Fujita et al. | |
| 2002/0158266 A1 | | 10/2002 | Sato et al. | |
| 2010/0202485 A1 | | 8/2010 | Kobayashi | |
| 2017/0250521 A1 | * | 8/2017 | Nakamura | H01S 5/1064 |
| 2020/0021080 A1 | | 1/2020 | Krutko et al. | |

FOREIGN PATENT DOCUMENTS

| | | | |
|---|---|---|---|
| JP | H07221400 A | 8/1995 |
| JP | 2002280662 A | 9/2002 |
| JP | 2002324936 A | 11/2002 |
| JP | 2003347653 A | 12/2003 |
| JP | 2010212664 A | 9/2010 |
| JP | 2013025836 A | 2/2013 |
| JP | 2017157583 A | 9/2017 |
| JP | 2019129216 A | 8/2019 |

* cited by examiner

SEMICONDUCTOR OPTICAL INTEGRATED DEVICE

CROSS-REFERENCE TO RELATED APPLICATIONS

The present application claims priority to Japan Patent Application No. 2021-168922 filed on Oct. 14, 2021 and 2021-197845 filed on Dec. 6, 2021, the contents of which are hereby incorporated by reference into this application.

TECHNICAL FIELD

The present disclosure relates generally to a semiconductor optical integrated device.

BACKGROUND

A semiconductor optical integrated device can include optical function devices that are integrated. The optical function devices include a semiconductor layer and electrodes made of a metal on the semiconductor layer. The electrodes are independent of each other to enable independent operation of the optical function devices.

In a process for forming the electrodes, a stress is generated in the semiconductor layer due to temperature changes due and a difference between thermal expansion coefficients of the metal and the semiconductor. In a process for mounting the electrodes on a submount, a stress is generated in the semiconductor layer due to temperature changes due and a difference between thermal expansion coefficients of a connecting solder and the semiconductor layer.

In an area (without electrodes) interposed between a pair of electrodes, the semiconductor layer has no stress generated therein due to a thermal expansion coefficient difference, but the area is affected by a stress generated under the pair of electrodes. For example, an expansion (tensile) stress may be caused by a compressive stress generated under the pair of electrodes. A mixture of a compressed area and an expanded area causes characteristic degradation, such as uneven grating spacing of a diffraction grating.

SUMMARY

Some implementations described herein reduce reliability degradation due to stress.

In some implementations, a semiconductor optical integrated device includes: a mesa stripe structure in a stripe shape extending in a first direction, the mesa stripe structure having a first portion and a second portion spaced apart and arranged in the first direction, the mesa stripe structure having a third portion between the first portion and the second portion, the mesa stripe structure comprising a semiconductor; and an electrode pattern including a first electrode that overlaps with the first portion but does not overlap with the second portion, the electrode pattern including a second electrode that overlaps with the second portion but does not overlap with the first portion, the first electrode and the second electrode being separated, the electrode pattern comprising a metal in a shape of not overlapping with the third portion. The electrode pattern includes an adjacent area not overlapping with the mesa stripe structure. The adjacent area is next to the third portion in a second direction orthogonal to the first direction. The adjacent area is on a semiconductor layer continuous to the mesa stripe structure.

DETAILED DESCRIPTION

Figure 1:
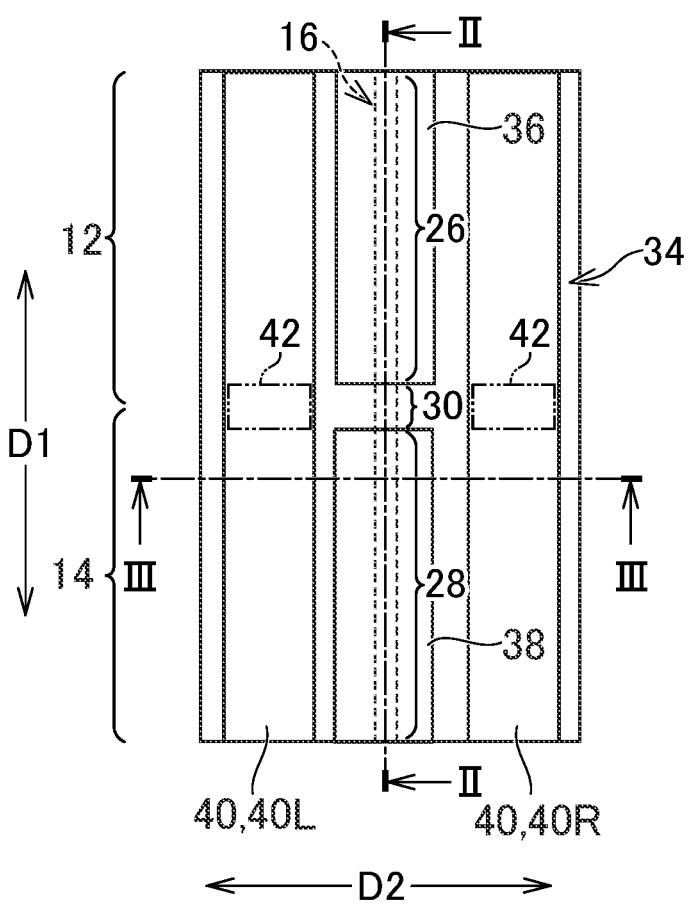
FIG. 1 is a plan view of a semiconductor optical integrated device according to a first example implementation.

Some implementations are specifically described in detail in the following with reference to drawings. In the drawings, the same members are denoted by the same reference numerals and have the same or equivalent functions, and a repetitive description thereof may be omitted for the sake of simplicity. Note that, the drawings referred to in the following are only for illustrating the example implementations, and are not necessarily drawn to scale.

Figure 2:
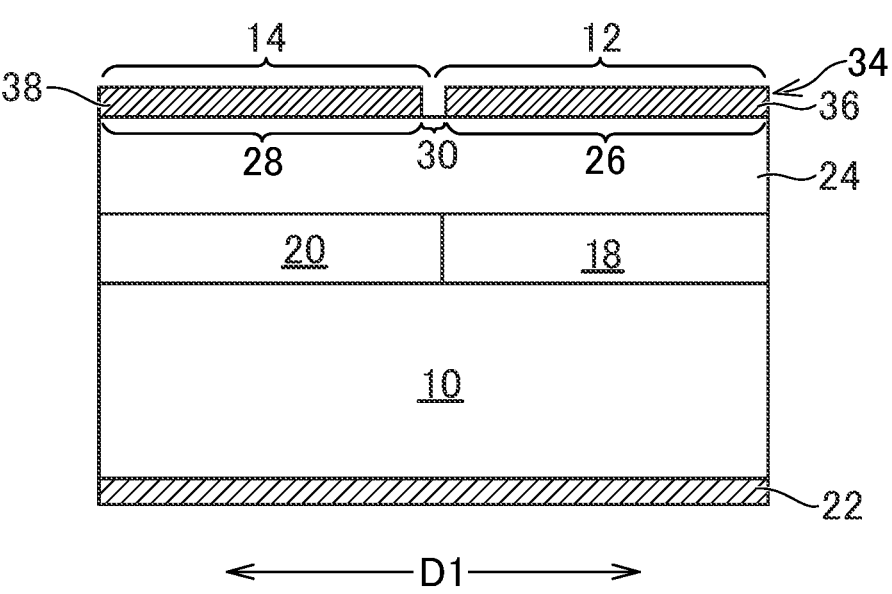
FIG. 2 is a II-II cross-sectional view of the semiconductor optical integrated device in FIG. 1.
Figure 3:
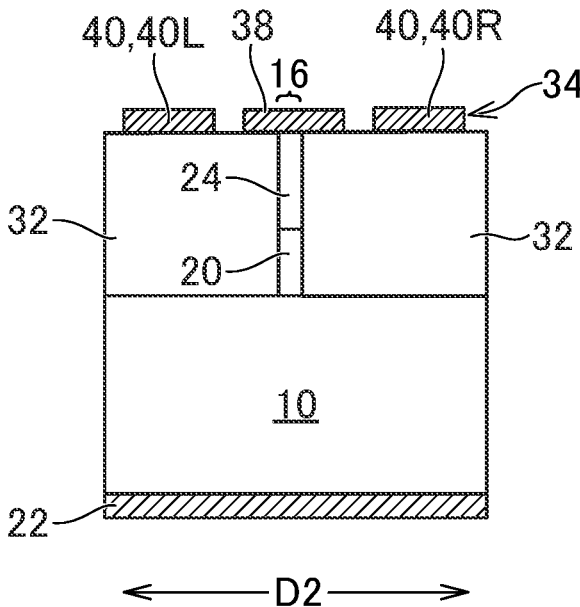
FIG. 3 is a III-III cross-sectional view of the semiconductor optical integrated device in FIG. 1.

FIG. 1 is a plan view of a semiconductor optical integrated device according to a first example implementation. FIG. 2 is a II-II cross-sectional view of the semiconductor optical integrated device in FIG. 1. FIG. 3 is a III-III cross-sectional view of the semiconductor optical integrated device in FIG. 1. The semiconductor optical integrated device may have a first optical function device 12 and a second optical function device 14, integrated in a substrate 10. A back electrode 22 may be provided on a back of the substrate 10. The back electrode 22 may be common to the first optical function device 12 and the second optical function device 14, or alternatively it may be separately provided for each.

The semiconductor optical integrated device may have a mesa stripe structure 16. The mesa stripe structure 16 extends in a stripe shape in a first direction D1 and may be made of a semiconductor. The mesa stripe structure 16 may be a waveguide over both the first optical function device 12 and the second optical function device 14. The first optical function device 12 may have a first optical function layer 18, whereas the second optical function device 14 may have a second optical function layer 20.

Each of the first optical function layer 18 and the second optical function layer 20 may be a multiple quantum well (MQW) or a bulk semiconductor layer, for example, a layer that optically functions when a voltage is applied (e.g., an active layer that oscillates a laser beam or absorbs light in response to the voltage), or a passive waveguide. The first optical function layer 18 and the second optical function layer 20 may be monolithically connected via a butt joint (BJ) structure.

A clad layer 24 may be disposed on the first optical function layer 18 and the second optical function layer 20. The clad layer 24 may be continuously integrated or may be individualized on each of the first optical function layer 18 and the second optical function layer 20. There may be an unillustrated contact layer on the clad layer 24.

The mesa stripe structure 16 may have a first portion 26 and a second portion 28 that are spaced apart in the first direction D1. The mesa stripe structure 16 may have a third portion 30 between the first portion 26 and the second portion 28. A boundary of the first optical function device 12 and the second optical function device 14 may be at the third portion 30.

A semiconductor layer 32 may be in contact with a side of the mesa stripe structure 16 (FIG. 3). The semiconductor layer 32 may be comprise a semi-insulating semiconductor, may be an embedded layer of the mesa stripe structure 16, and may be a buried hetero (BH) structure.

The semiconductor optical integrated device may have an electrode pattern 34 (FIG. 1). The electrode pattern 34 may be made of a metal (e.g., Au) in a shape of avoiding overlap with the third portion 30.

The electrode pattern 34 may include a first electrode 36 that overlaps with the first portion 26 but does not overlap with the second portion 28. The first optical function device 12 may have the first electrode 36 to drive the first optical function layer 18.

The electrode pattern 34 may include a second electrode 38 that overlaps with the second portion 28 but does not overlap with the first portion 26. The first electrode 36 and the second electrode 38 are separated (electrically insulated). The clad layer 24 may be common to and provided on the first optical function layer 18 and the second optical function layer 20, whereby the second optical function layer 20 may be driven through the second electrode 38 although voltage leakage may be not completely eliminated. A voltage applied to the first electrode 36 does not drive the second optical function layer 20.

The electrode pattern 34 may include a third electrode 40 separated (e.g., electrically insulated) from the first electrode 36 and the second electrode 38. The third electrode 40 may be a right-side electrode 40R and a left-side electrode 40L that sandwich the mesa stripe structure 16 in a second direction D2 orthogonal to the first direction D1. The right-side electrode 40R and the left-side electrode 40L may be equal in planar size. The third electrode 40 may be next, in the second direction D2, to at least part of the first electrode 36 and at least part of the second electrode 38. The third electrode 40 may be a floating electrode that is not electrically connected to the mesa stripe structure 16.

The electrode pattern 34 may include an adjacent area 42 (FIG. 1). The adjacent area 42 does may not overlap with the mesa stripe structure 16. The adjacent area 42 may be next to the third portion 30 in the second direction D2. The adjacent area 42 may be on the semiconductor layer 32 (buried layer) in contact with the mesa stripe structure 16. The adjacent area 42 may be part of the third electrode 40. The adjacent area 42 may be a pair of adjacent areas 42 that sandwich the mesa stripe structure 16.

Figure 4:
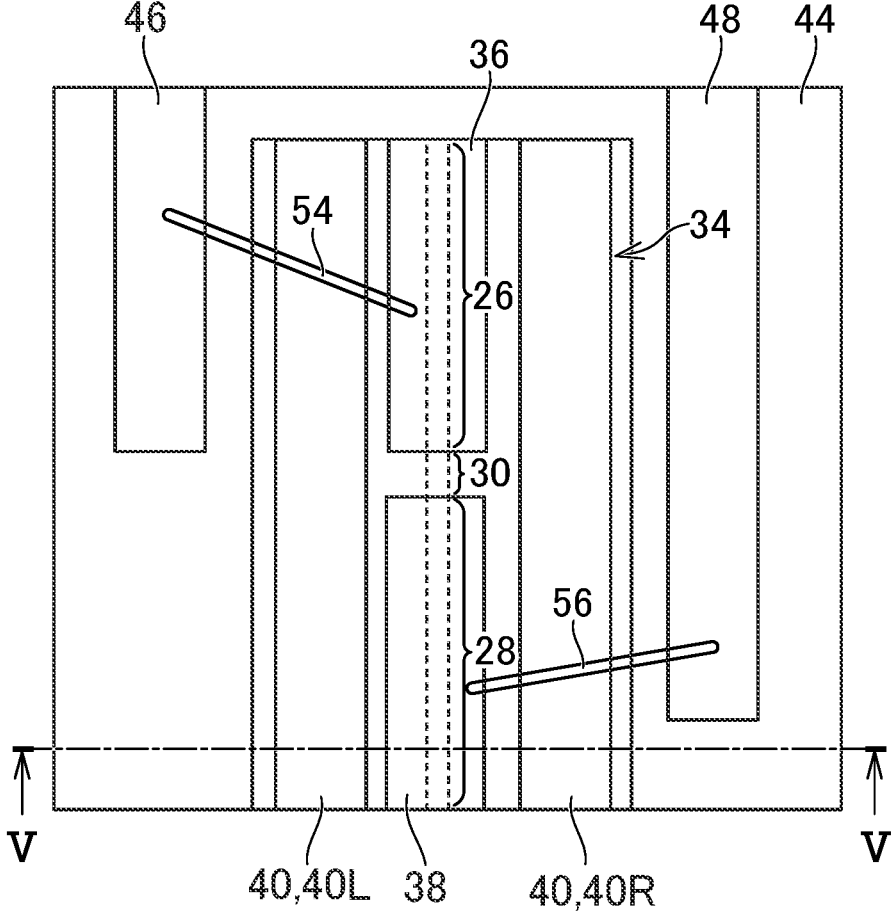
FIG. 4 is a plan view of a submount on which the semiconductor optical device in FIG. 1 is mounted.
Figure 5:
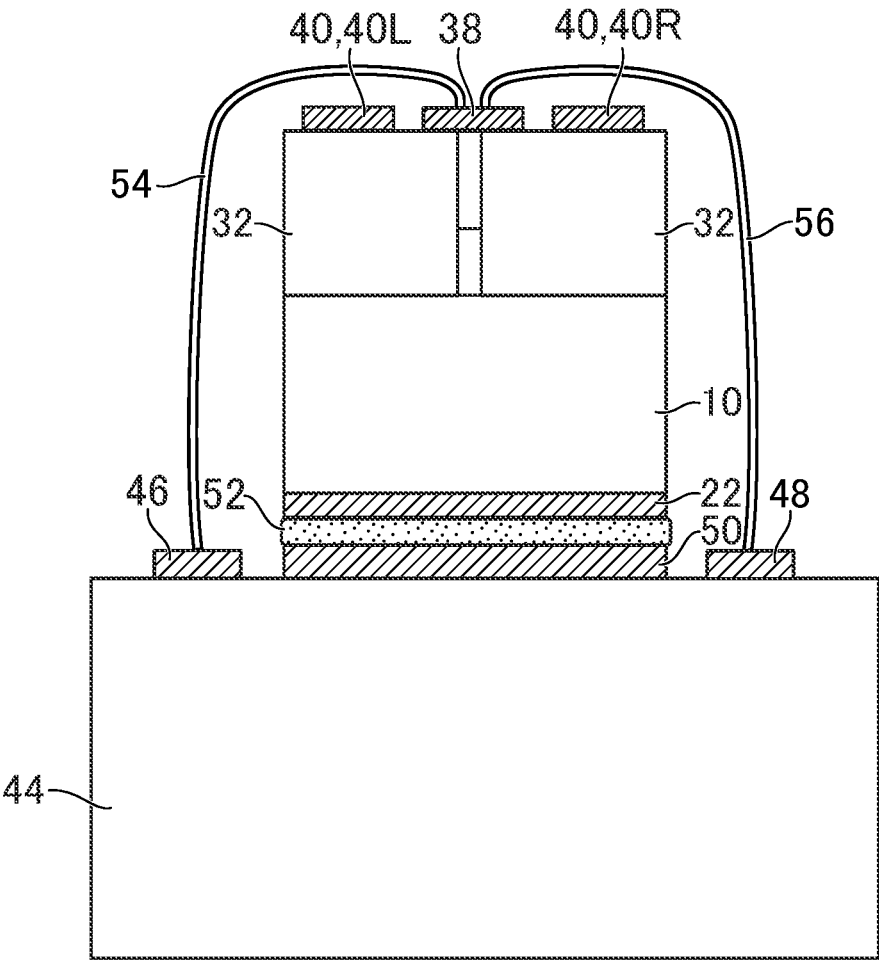
FIG. 5 is a V-V cross-sectional view of a structure in FIG. 4.

FIG. 4 is a plan view of a submount on which the semiconductor optical device in FIG. 1 may be mounted. FIG. 5 is a V-V cross-sectional view of a structure in FIG. 4.

The semiconductor optical integrated device may be a mounted junction up on a submount 44. The submount 44 may be equipped with interconnection lines 46, 48, 50. The back electrode 22 may be bonded to the interconnection line 50 with solder 52. The interconnection line 50 may be connected to unillustrated ground potential. The interconnection line 46 and the first electrode 36 may be connected with a wire 54. The interconnection line 48 and the second electrode 38 may be connected with a wire 56. The interconnection line 46 and the interconnection line 48 may be connected to an unillustrated external power source.

In a process of bonding the semiconductor optical integrated device on the submount 44, the solder 52 may be melted by heat and then cooled to solidify. The metallic electrode pattern 34 may be larger in thermal expansion coefficient than that of the first portion 26 and the second portion 28, which are made of the semiconductor. Therefore, after cooling, the first portion 26 and the second portion 28 may have a stress (compressive stress) generated therein. The stress may be greatest just below respective ends of the first electrode 36 and the second electrode 38. The third portion 30 may have a stress (expansion stress or tensile stress) generated therein, due to being sandwiched between the first portion 26 and the second portion 28. However, that stress is offset by another stress (compressive stress) generated in the semiconductor layer 32 under the electrode pattern 34 (adjacent area 42) next to the third portion 30. This can suppress reliability degradation caused by the stress. In particular, the first optical function layer 18 and the second optical function layer 20 may be different in optical density or current density while driven, making it advantageous in terms of reliability and characteristics to suppress generation of the stress. The stress generated by the difference in the thermal expansion coefficient between the first electrode 36 and the second electrode 38 and the semiconductor also occurs in a manufacturing process of the semiconductor optical integrated device. For example, when an alloying process follows the electrode formation, the stress may be generated during a cooling process after the alloying process, just like the process of being bonded on the submount 44 described above. However, as described above, the stress in the third portion 30 may be offset by the electrode pattern 34 (adjacent area 42).

Figure 6:
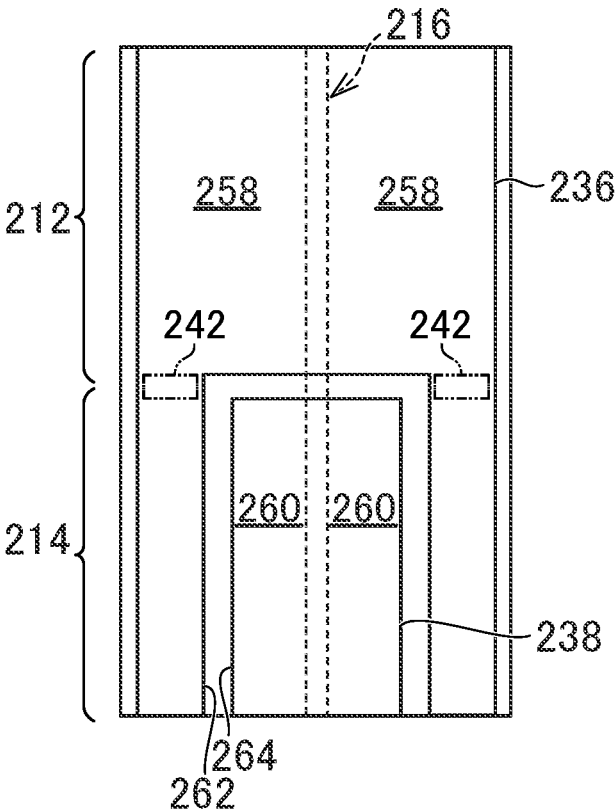
FIG. 6 is a plan view of a semiconductor optical integrated device according to a second example implementation.

FIG. 6 is a plan view of a semiconductor optical integrated device according to a second example implementation. The adjacent area 242 may be part of at least one (e.g., the first electrode 236) of the first electrode 236 and the second electrode 238. The adjacent area 242 may be a pair of adjacent areas 242 that sandwich the mesa stripe structure 216. The first electrode 236 integrally may include a first non-overlapping region 258 not overlapping with the mesa stripe structure 216. The second electrode 238 integrally may include a second non-overlapping region 260 not overlapping with the mesa stripe structure 216. The first non-overlapping region 258 and the second non-overlapping region 260 may have the first edge 262 and the second edge 264, respectively, opposed to each other.

This example implementation also suppresses the reliability degradation due to the stress, the details of which are as described in the first example implementation. Further, the first electrode 236 itself may be wide, improving heat radiation from the first electrode 236, improving optical output characteristics during high temperature operation. The first electrode 236 may be electrically connected to the clad layer in the first optical function device 212, without any electrical effect on the clad layer in the second optical function device 214.

Figure 7:
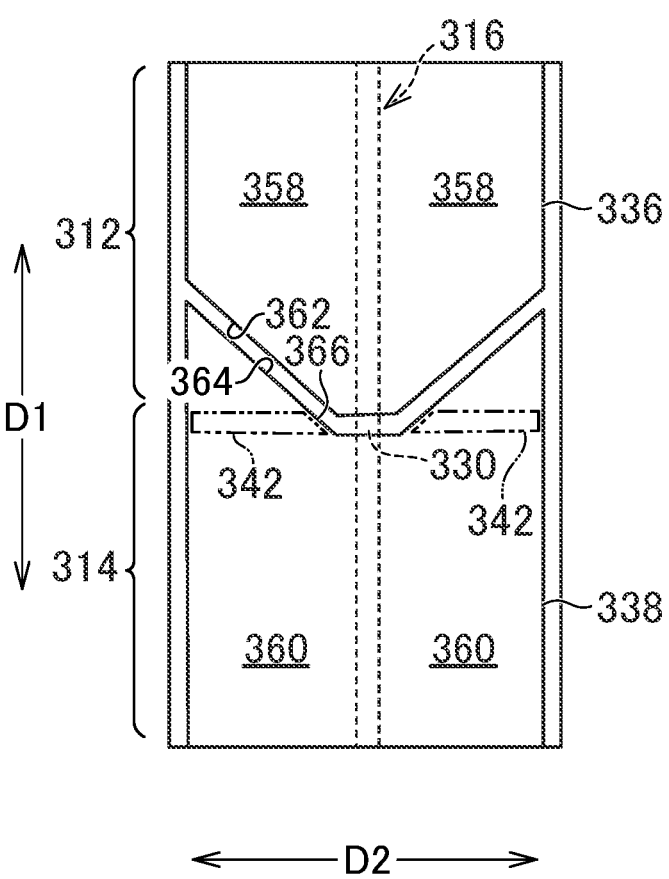
FIG. 7 is a plan view of a semiconductor optical integrated device according to a third example implementation.

FIG. 7 is a plan view of a semiconductor optical integrated device according to a third example implementation. The adjacent area 342 may be part of at least one (e.g., second electrode 338) of the first electrode 336 and the second electrode 338. The adjacent area 342 may be a pair of adjacent areas 342 sandwiching the mesa stripe structure 316. The first electrode 336 integrally may include a first non-overlapping region 358 not overlapping with the mesa stripe structure 316. The second electrode 338 integrally may include a second non-overlapping region 360 not overlapping with the mesa stripe structure 316. The first non-overlapping region 358 and the second non-overlapping region 360 may have the first edge 362 and the second edge 364, respectively, opposed to each other.

This example implementation also suppresses the reliability degradation due to the stress, the details of which are as described in the first example implementation. Further, the first electrode 336 itself may be wide, improving heat radiation from the first electrode 336, improving optical output characteristics during high temperature operation. The first electrode 336 may be electrically connected to the clad layer in the first optical function device 312, without any electrical effect on the clad layer in the second optical function device 314.

At least one (e.g., second edge 364) of the first edge 362 and the second edge 364 may include an oblique edge 366 intersecting with and slanted to the first direction D1 and the second direction D2. Part of the oblique edge 366 may be an edge of the adjacent area 342.

Just under the edge (oblique edge 366) of the adjacent area 342, a stress may be generated in the semiconductor layer. If that stress is too strong, it may be more than necessary to offset the stress in the third portion 330, so the stress, which affects the third portion 330, should be reduced if necessary. Accordingly, the oblique edge 366 may be made slanted, thereby dispersing the stress generated in a direction (second direction D2) perpendicular to an extending direction of the mesa stripe structure 316. This makes it possible to provide the semiconductor optical integrated device excellent in terms of reliability.

Figure 8:
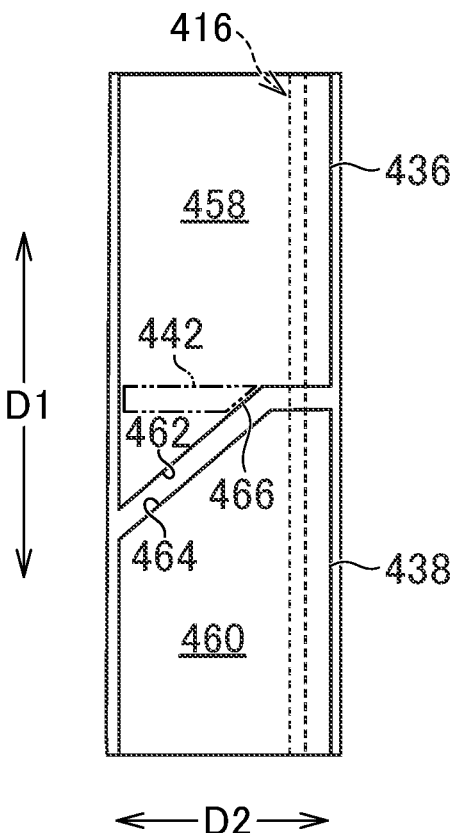
FIG. 8 is a plan view of a semiconductor optical integrated device according to a fourth example implementation.

FIG. 8 is a plan view of a semiconductor optical integrated device according to a fourth example implementation. The adjacent area 442 may be part of at least one (e.g., first electrode 436) of the first electrode 436 and the second electrode 438. The adjacent area 442 may be only on one side of the mesa stripe structure 416. The first electrode 436 integrally may include the first non-overlapping region 458 not overlapping with the mesa stripe structure 416. The second electrode 438 integrally may include the second non-overlapping region 460 not overlapping with the mesa stripe structure 416. The first non-overlapping region 458 and the second non-overlapping region 460 extend on the one side of the mesa stripe structure 416.

The first non-overlapping region 458 and the second non-overlapping region 460 may have the first edge 462 and the second edge 464, respectively, opposed to each other. At least one (e.g., first edge 462) of the first edge 462 and the second edge 464 may have the oblique edge 466 intersecting with and slanted to the first direction D1 and the second direction D2. Part of the oblique edge 466 may be the edge of the adjacent area 442.

This example implementation may be narrower in a width (second direction D2) of the semiconductor optical integrated device than the first example implementation. Unillustrated wires may be bonded to the first electrode 436 and the second electrode 438 for an external electrical input. For this purpose, a certain size may be necessary. Also, from a viewpoint of reliability, it may be preferable not to bond a wire to an area directly on and near the mesa stripe structure 416. Therefore, the mesa stripe structure 416 may not be at a center in the second direction D2 but may be closer to one side. Even in this example implementation, the effects described in the first example implementation are achieved.

Figure 9:
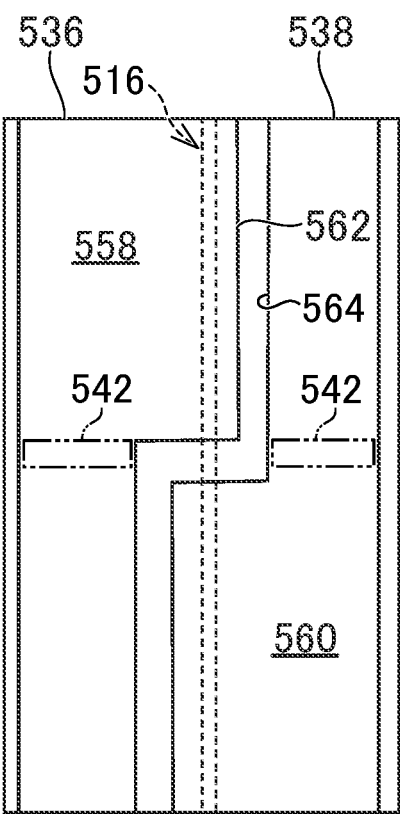
FIG. 9 is a plan view of a semiconductor optical integrated device according to a fifth example implementation.

FIG. 9 is a plan view of a semiconductor optical integrated device according to a fifth example implementation. The adjacent area 542 may be part of at least one (e.g., both) of the first electrode 536 and the second electrode 538. The adjacent area 542 may be a pair of adjacent areas 542 that sandwich the mesa stripe structure 516. The first electrode 536 integrally may include the first non-overlapping region 558 not overlapping with the mesa stripe structure 516. The second electrode 538 integrally may include the second non-overlapping region 560 not overlapping with the mesa stripe structure 516. The first non-overlapping region 558 and the second non-overlapping region 560 may have the first edge 562 and the second edge 564, respectively, opposed to each other. This example implementation also reduces the reliability degradation due to the stress, the details of which are as described in the first example implementation.

Figure 10:
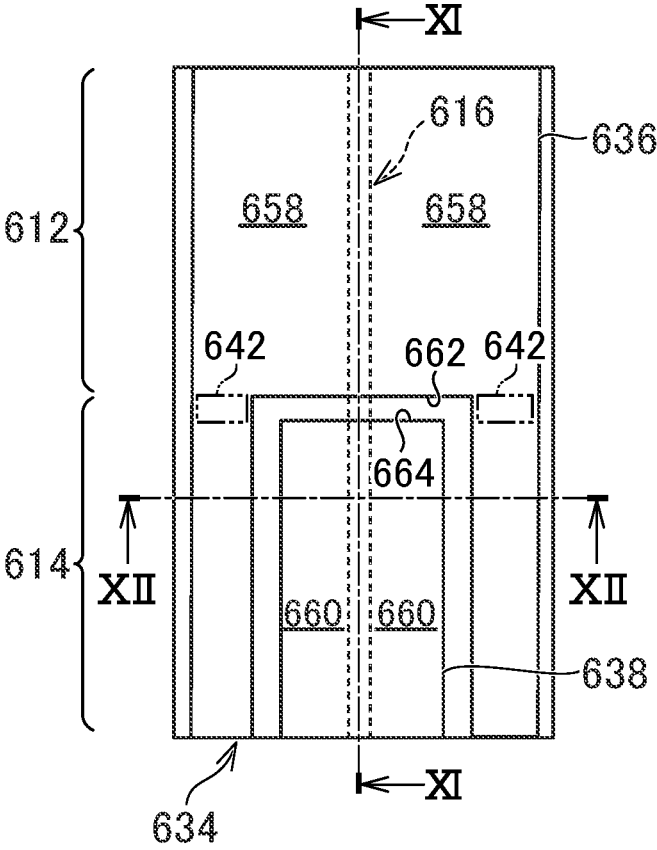
FIG. 10 is a plan view of a semiconductor optical integrated device according to a sixth example implementation.
Figure 11:
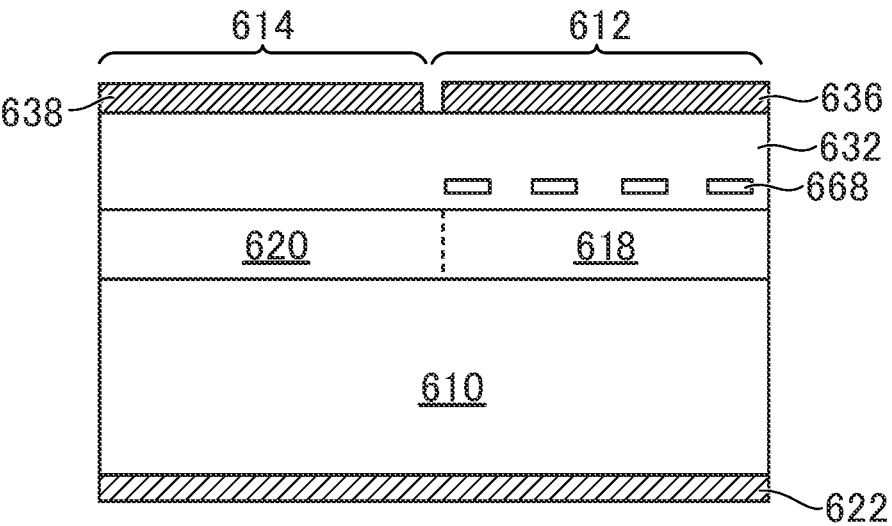
FIG. 11 is an XI-XI cross-sectional view of the semiconductor optical integrated device in FIG. 10.
Figure 12:
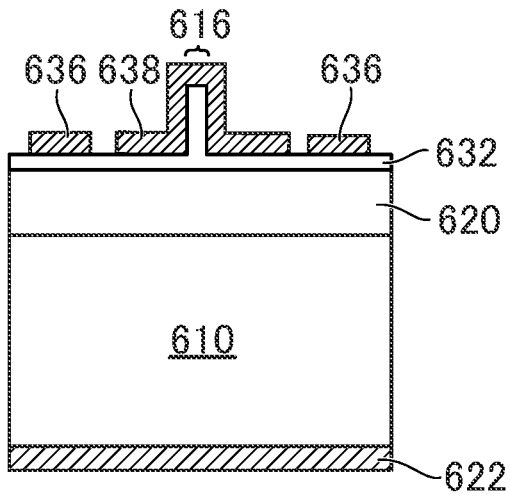
FIG. 12 is a XII-XII cross-sectional view of the semiconductor optical integrated device in FIG. 10.

FIG. 10 is a plan view of a semiconductor optical integrated device according to a sixth example implementation. FIG. 11 is an XI-XI cross-sectional view of the semiconductor optical integrated device in FIG. 10. FIG. 12 is a XII-XII cross-sectional view of the semiconductor optical integrated device in FIG. 10.

The first optical function device 612 may be a distributed feedback (DFB) laser with a diffraction grating 668 (FIG. 1), or may be a direct modulation type laser configured to output modulation signals or a continuous wave (CW) laser configured to output continuous light. The second optical function device 614 may be a semiconductor type amplifier. The second optical function device 614 may be configured to amplify the laser light from the first optical function device 612 by applying a voltage (injecting a current) between the second electrode 638 and the back electrode 622. The amplified laser light may be used as signal light for optical communication.

The first optical function layer 618 and the second optical function layer 620 may be the same multiple quantum well. Therefore, there may be no crystalline boundary but a boundary indicated with a dotted line in FIG. 11 to distinguish operation of optical functions. Or, the first optical function layer 618 and the second optical function layer 620 may be different multiple quantum well layers. An unillustrated optical confinement layer may be provided on or under the multiple quantum well layer.

The first optical function layer 618 and the second optical function layer 620 may be widely spread over the substrate 610. The semiconductor layer 632 (clad layer) on them may have a projection to constitute a lower end of the mesa stripe structure 616. The mesa stripe structure 616 may be continuous from part of an upper surface of the semiconductor layer 632. The upper surface of the semiconductor layer 632 may be lower than an upper surface of the mesa stripe structure 616. Each of the first electrode 636 and the second electrode 638 may have a portion overlapping with a top and a side of the mesa stripe structure 616 (FIG. 12).

The adjacent area 642 may be part of at least one (e.g., first electrode 636) of the first electrode 636 and the second electrode 638. The adjacent area 642 may be a pair of adjacent areas 642 sandwiching the mesa stripe structure 616. The first electrode 636 integrally may include the first non-overlapping region 658 not overlapping with the mesa stripe structure 616. The second electrode 638 integrally may include the second non-overlapping region 660 not overlapping with the mesa stripe structure 616. The first non-overlapping region 658 and the second non-overlapping region 660 may have the first edge 662 and the second edge 664, respectively, opposed to each other. The electrode pattern 634 may be in a shape shown in FIG. 5, 6, or 7.

The integrated semiconductor device may be a ridge type with no buried layer. Therefore, a larger stress may be applied to the mesa stripe structure 616. The stress causes a pitch of the diffraction grating 668 to change in a direction parallel to an optical axis of the first optical function device 612. The changing amount may be proportional to the stress, degrading optical characteristics due to a non-uniform pitch of the diffraction grating 668. However, this example implementation also suppresses the reliability degradation due to the stress, the details of which are as described in the first example implementation.

Figure 13:
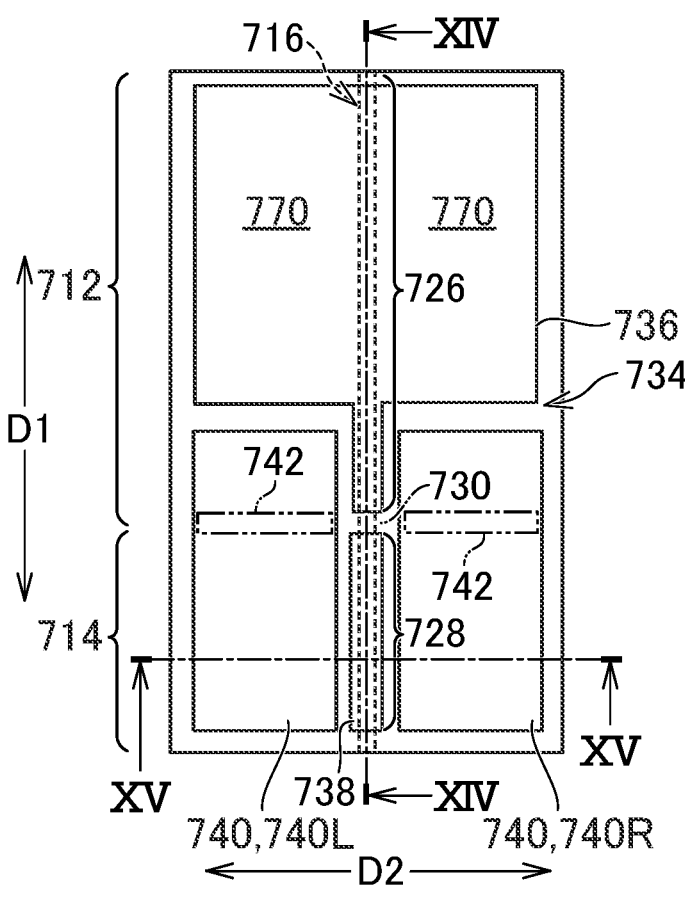
FIG. 13 is a plan view of a semiconductor optical integrated device according to a seventh example implementation.
Figure 14:
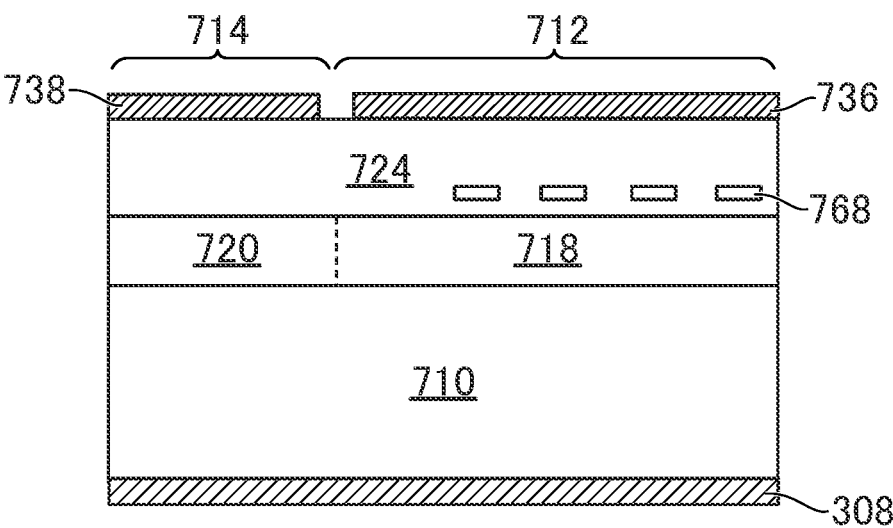
FIG. 14 is a XIV-XIV cross-sectional view of the semiconductor optical integrated device in FIG. 13.
Figure 15:
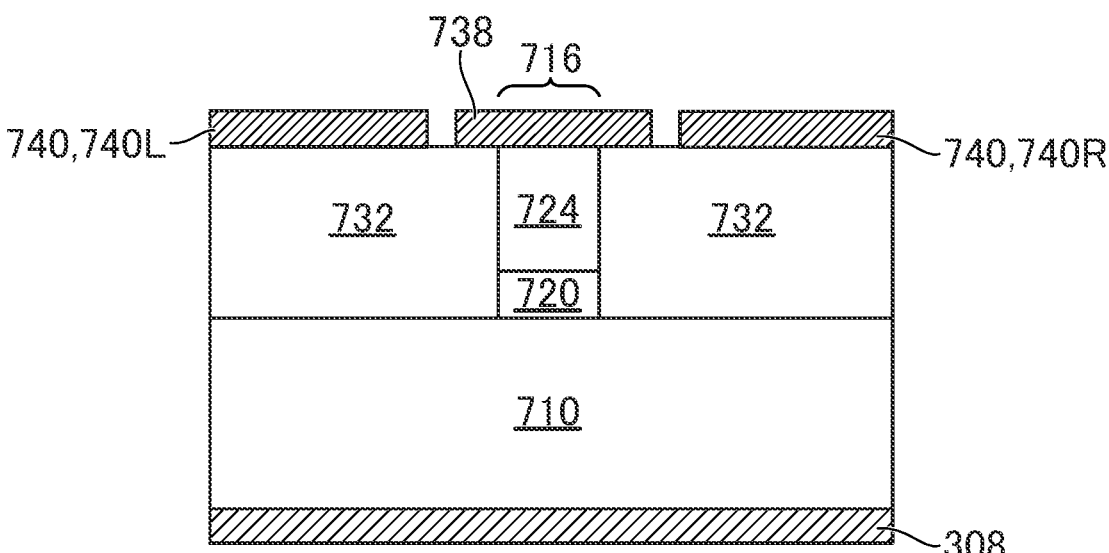
FIG. 15 is a XV-XV cross-sectional view of the semiconductor optical integrated device in FIG. 13.

FIG. 13 is a plan view of a semiconductor optical integrated device according to a seventh example implementation. FIG. 14 is a XIV-XIV cross-sectional view of the semiconductor optical integrated device in FIG. 13. FIG. 15 is a XV-XV cross-sectional view of the semiconductor optical integrated device in FIG. 13.

The semiconductor layer 732 may be in contact with a side of the mesa stripe structure 716. Both sides of the mesa stripe structure 716 are embedded with the semiconductor layer 732. Each of the first optical function device 712 and the second optical function device 714 may be an embedded semiconductor device. The semiconductor layer 732 may be an InP layer doped with Fe. The substrate 710 may be made of n-type InP. The clad layer 724 may be made of p-type InP.

The first optical function device 712 and the second optical function device 714 may be connected depending on the BJ structure. Between the first optical function device 712 and the second optical function device 714, another structure (e.g., passive waveguide structure) may be included. The passive waveguide may have a bulk waveguide structure serving as an optical function layer.

The first optical function device 712 may be the DFB laser equipped with the diffraction grating 768. The first optical function layer 718 may be composed of the multiple quantum well layer and the optical confinement layer sandwiching the multiple quantum well layer above and below it. The second optical function device 714 may be either a field absorption type modulator or a Mach-Zehnder type optical modulator. A field-absorption type optical modulator and a Mach-Zehnder type optical modulator are referred to as an external optical modulator configured to convert continuous light input from outside into modulated light. By applying a voltage of a high-frequency signal to the second optical function device 714, a high-frequency optical signal may be generated. The second optical function layer 720 may be composed of the multiple quantum well layer serving as an absorption layer and the optical confinement layer sandwiching the multiple quantum well layer above and below it.

The electrode pattern 734 may include a third electrode 740 separated from the first electrode 736 and the second electrode 738. The electrode pattern 734 may have a multilayered electrode structure of Ti, Pt, and Au in order from the clad layer 724. The third electrode 740 may be the right-side electrode 740R and the left-side electrode 740L sandwiching the mesa stripe structure 716 in the second direction D2. The right-side electrode 740R and the left-side electrode 740L are equal in planar size. The third electrode 740 may be next, in the second direction D2, to at least part of the first electrode 736 and at least part of the second electrode 738.

At least one (e.g., first electrode 736) of the first electrode 736 and the second electrode 738 integrally may include the non-overlapping region 770 not overlapping with the mesa stripe structure 716. The third electrode 740 may be next, in the first direction D1, to the non-overlapping region 770. The adjacent area 742 may be part of the third electrode 740. The adjacent area 742 may be a pair of adjacent areas 742 that sandwich the mesa stripe structure 716.

The first optical function device 712 serving as a laser may be configured to generate heat during operation, making it desirable to arrange the electrodes as widely as possible to ensure heat dissipation. For this reason, the first electrode 736 may be wide but may have an area, adjacent to the third electrode 740, in an elongated shape to be disposed only just above and near the mesa stripe structure 716. The second optical function device 714, serving as an electric field absorption type optical modulator, may have the second electrode 738 only just above and near the mesa stripe structure 716 to reduce the parasitic capacitance and to achieve good high-frequency characteristics.

The semiconductor optical integrated device may be suitable for being mounted junction-down on an unillustrated submount. In the junction-down, the first electrode 736 and the second electrode 738 are directly soldered to the sub-mount. Therefore, the first portion 726 and the second portion 728 of the mesa stripe structure 716 may have a high stress (e.g., compressive stress) generated therein. Correspondingly, the stress (e.g., expansion stress) in the third portion 730 may be also high. Thus, a stress balance may be inconstant in an optical axis direction of the mesa stripe structure 716. However, the third electrode 740 can also relieve unevenness of the stress by being directly soldered to the submount.

Figure 16:
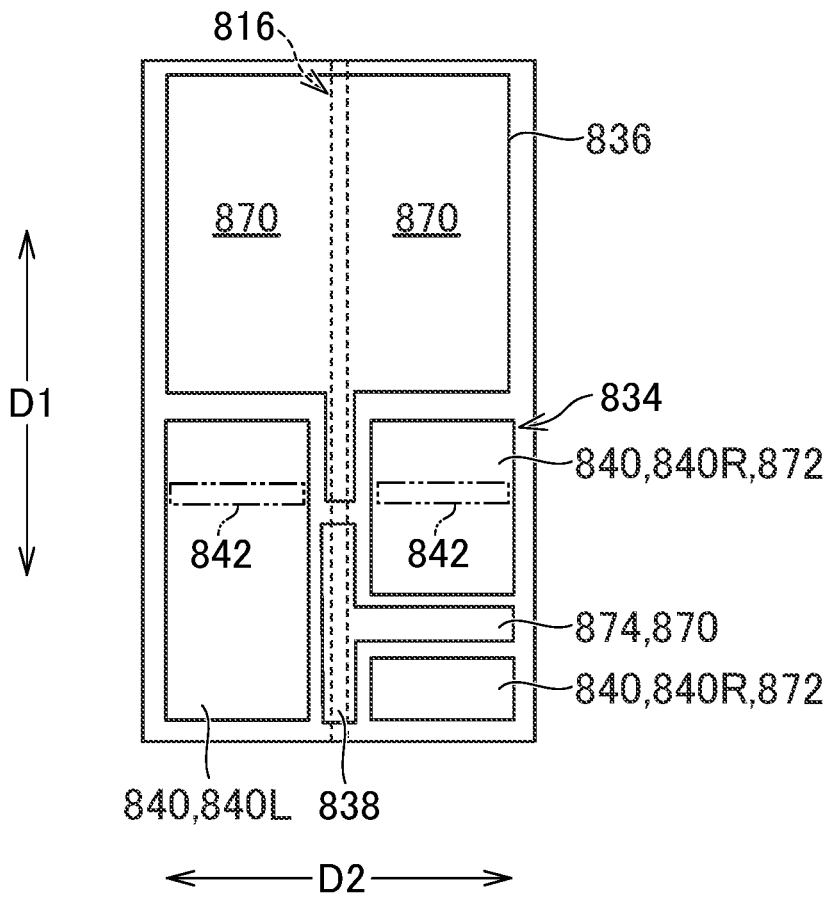
FIG. 16 is a plan view of a semiconductor optical integrated device according to an eighth example implementation.

FIG. 16 is a plan view of a semiconductor optical integrated device according to an eighth example implementation. The electrode pattern 834 may include a third electrode 840 separated from the first electrode 836 and the second electrode 838. At least one of the first electrode 836 and the second electrode 838 integrally may include the non-overlapping region 870 not overlapping with the mesa stripe structure 816. The third electrode 840 may be next to the non-overlapping region 870 in the first direction D1. The adjacent area 842 may be part of the third electrode 840. The adjacent area 842 may be a pair of adjacent areas 842 that sandwich the mesa stripe structure 816.

The third electrode 840 may be next, in the second direction D2, to at least part of the first electrode 836 and at least part of the second electrode 838. The third electrode 840 may be the right-side electrode 840R and the left-side electrode 840L that sandwich the mesa stripe structure 816 in the second direction D2. At least one of the right-side electrode 840R and the left-side electrode 840L may be separated into some electrode portions 872. At least one (e.g., second electrode 838) of the first electrode 836 and the second electrode 838 integrally may include a branch portion 874 between the electrode portions 872. The second electrode 838 may be configured to may have a voltage applied thereto through the branch portion 874. The branch portion 874 may be also the non-overlapping region 870 not overlapping with the mesa stripe structure 816.

Figure 17:
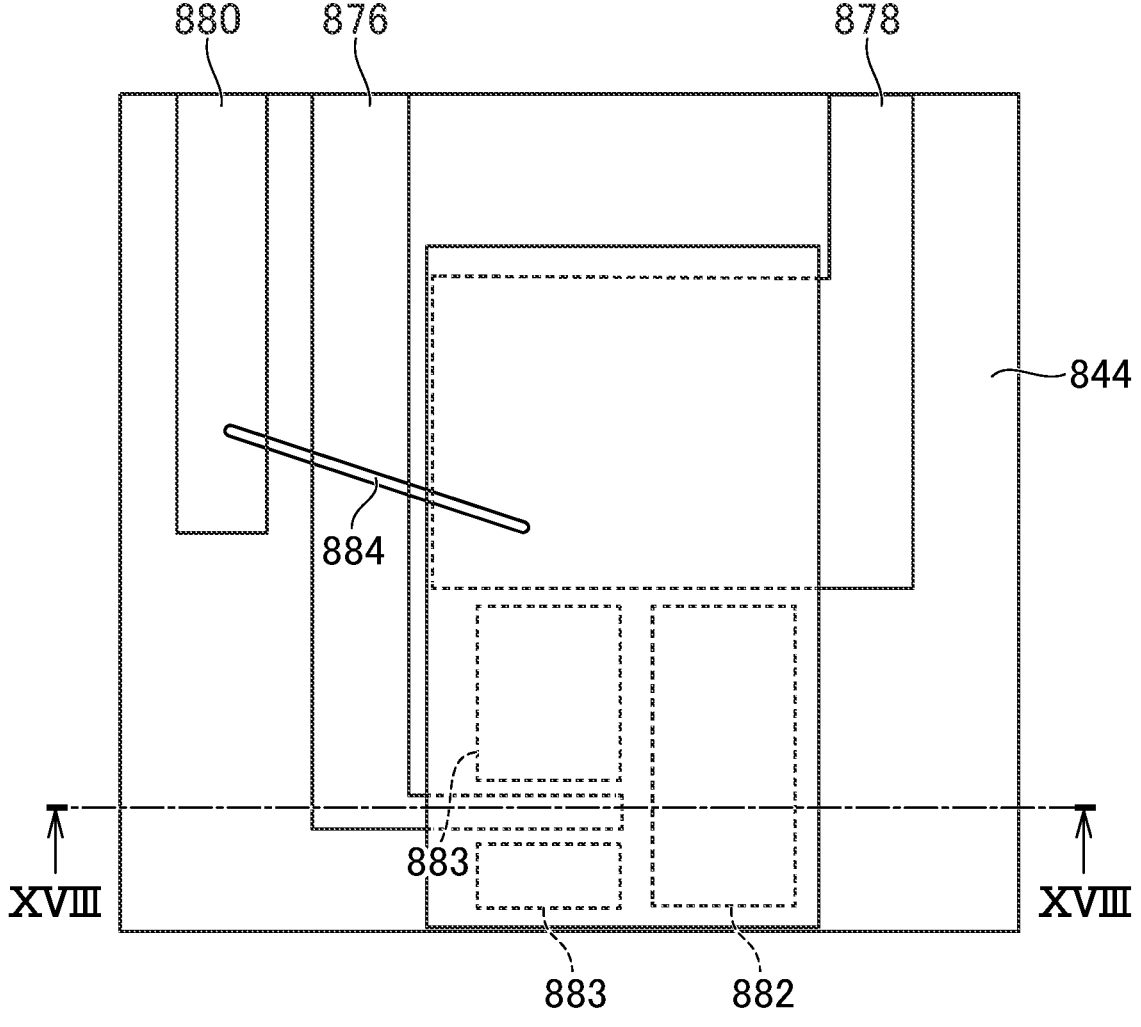
FIG. 17 is a plan view of a submount on which the semiconductor optical integrated device in FIG. 16 is mounted.
Figure 18:
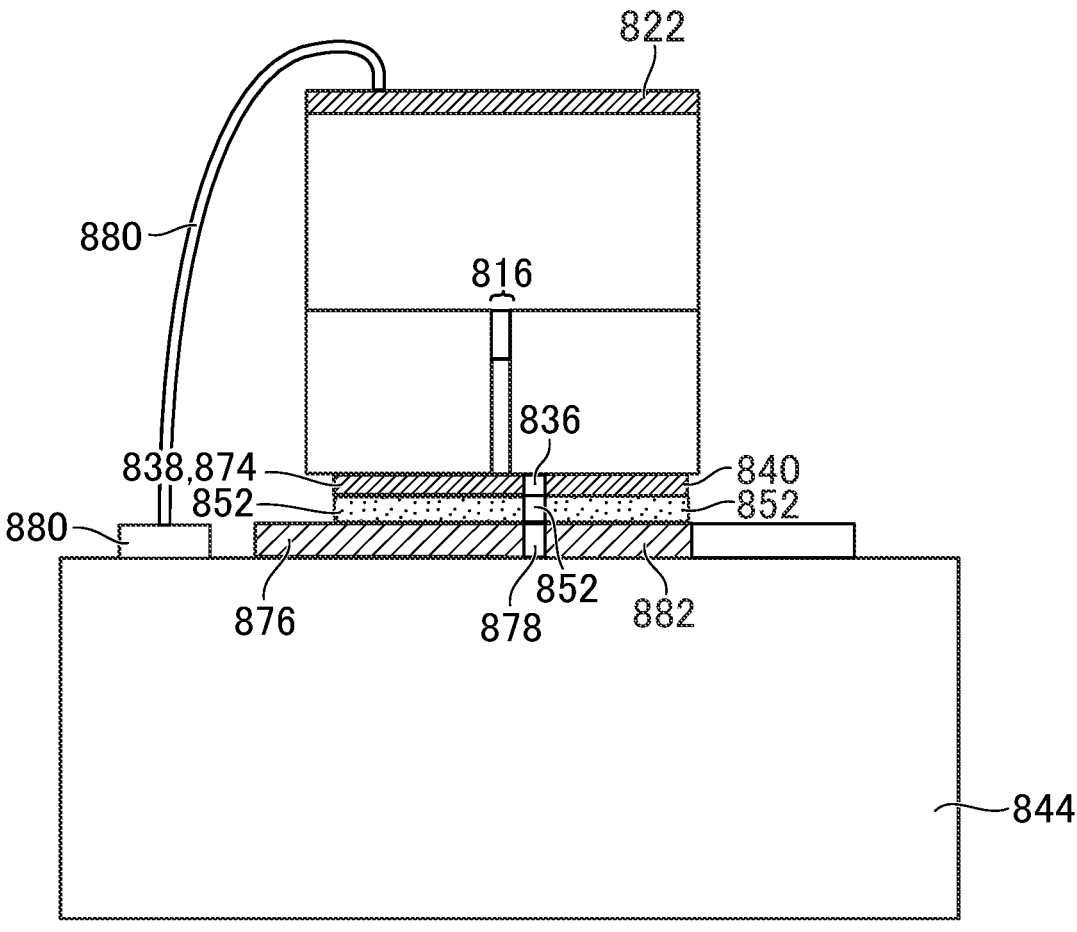
FIG. 18 is an XVIII-XVIII cross-sectional view of a structure in FIG. 17.

FIG. 17 is a plan view of a submount on which the semiconductor optical integrated device in FIG. 16 may be mounted. FIG. 18 may be an XVIII-XVIII cross-sectional view of a structure in FIG. 17. The submount 844 may be equipped with a modulator interconnection line 876 for driving the modulator, a laser interconnection line 878, a ground interconnection line 880 common to both of them, and electrically floating dummy pads 882, 883.

The semiconductor optical integrated device may be mounted junction-down on the submount 844. In the junction-down position, the first electrode 836, the second electrode 838, and the third electrode 840 may be respectively soldered to the submount 844 with solder 852. The first electrode 836 may be bonded to the laser interconnection line 878 with the solder 852. The second electrode 838 may be bonded to the modulator interconnection line 876 with the solder 852. The third electrode 840 may be bonded to the dummy pad 882 with the solder 852. The right-side electrode 840R may be also soldered to the dummy pad 883. The back electrode 822 may be connected to the ground interconnection line 880 with a ground wire 884.

The second electrode 838 may be soldered in an area (e.g., branch portion 874) that avoids overlap with the mesa stripe structure 816. The first electrode 836 may be also soldered in an area (e.g., non-overlapping area 870) that avoids overlap with the mesa stripe structure 816 where an effect of stress may be greatest. Therefore, even if a capacitance component may be parasitic on the branch portion 874, the stress on the mesa stripe structure 816 can be reduced.

In a first implementation, a semiconductor optical integrated device includes: a mesa stripe structure 16 in a stripe shape extending in a first direction D1, the mesa stripe structure 16 having a first portion 26 and a second portion 28 spaced apart and arranged in the first direction D1, the mesa stripe structure 16 having a third portion 30 between the first portion 26 and the second portion 28, the mesa stripe structure 16 comprising a semiconductor; and an electrode pattern 34 including a first electrode 36 that overlaps with the first portion 26 but does not overlap with the second portion 28, the electrode pattern 34 including a second electrode 38 that overlaps with the second portion 28 but does not overlap with the first portion 26, the first electrode 36 and the second electrode 38 being separated, the electrode pattern 34 comprising a metal in a shape of not overlapping with the third portion 30, the electrode pattern 34 including an adjacent area 42 not overlapping with the mesa stripe structure 16, the adjacent area 42 being next to the third portion 30 in a second direction D2 orthogonal to the first direction D1, the adjacent area 42 being on a semiconductor layer 32 continuous to the mesa stripe structure 16.

The first portion 26 and the second portion 28 overlap with the electrode pattern 34, thereby generating a stress due to a difference between thermal expansion coefficients of the semiconductor and the metal. The third portion 30 may be sandwiched between the first portion 26 and the second portion 28, thereby generating a stress, which may be offset by another stress generated in the semiconductor layer 32 under the adjacent area 42 next to the third portion 30. This can suppress reliability degradation due to the stress.

In a second implementation, alone or in combination with the first implementation, the semiconductor layer 32 is in contact with a side of the mesa stripe structure 16.

In a third implementation, alone or in combination with one or more of the first and second implementations, each of the first electrode 636 and the second electrode 638 includes a portion overlapping with a top and a side of the mesa stripe structure 616, the mesa stripe structure 616 is continuous from part of a top of the semiconductor layer 632, and the top of the semiconductor layer 632 is lower than the top of the mesa stripe structure 616.

In a fourth implementation, alone or in combination with one or more of the first through third implementations, the electrode pattern 34 further includes a third electrode 40 separated from the first electrode 36 and the second electrode 38, and the adjacent area 42 is part of the third electrode 40.

In a fifth implementation, alone or in combination with one or more of the first through fourth implementations, the third electrode 40 is a right-side electrode 40R and a left-side electrode 40L sandwiching the mesa stripe structure 16 in the second direction D2.

In a sixth implementation, alone or in combination with one or more of the first through fifth implementations, the right-side electrode 40R and the left-side electrode 40L are equal in planar size.

In a seventh implementation, alone or in combination with one or more of the first through sixth implementations, at least one of the right-side electrode 840R and the left-side electrode 840L is separated into some electrode portions 872.

In an eighth implementation, alone or in combination with one or more of the first through seventh implementations, at least one of the first electrode 836 and the second electrode 838 integrally includes a branch portion 874 between the electrode portions 872.

In a ninth implementation, alone or in combination with one or more of the first through eighth implementations, the third electrode 40 is next, in the second direction D2, to at least part of the first electrode 36 and at least part of the second electrode 38.

In a tenth implementation, alone or in combination with one or more of the first through ninth implementations, the third electrode 40 is next, in the second direction D2, to the entire first electrode 36 and the entire second electrode 38.

In an eleventh implementation, alone or in combination with one or more of the first through tenth implementations, at least one of the first electrode 736 and the second electrode 738 integrally includes a non-overlapping region 770 that does not overlap with the mesa stripe structure 716, and the third electrode 740 is next, in the first direction D1, to the non-overlapping region 770.

In an twelfth implementation, alone or in combination with one or more of the first through eleventh implementations, the adjacent area 242 is part of at least one of the first electrode 236 and the second electrode 238.

In a thirteenth implementation, alone or in combination with one or more of the first through twelfth implementations, the first electrode 236 integrally includes a first non-overlapping region 258 that does not overlap with the mesa stripe structure 216, the second electrode 238 integrally includes a second non-overlapping region 260 that does not overlap with the mesa stripe structure 216, and the first non-overlapping region 258 and the second non-overlapping region 260 have a first edge 262 and a second edge 264, respectively, opposed to each other.

In a fourteenth implementation, alone or in combination with one or more of the first through thirteenth implementations, at least one of the first edge 362 and the second edge 364 includes an oblique edge 366 intersecting with and slanted to the first direction D1 and the second direction D2, and part of the oblique edge 366 is an edge of the adjacent area 342.

In a fifteenth implementation, alone or in combination with one or more of the first through fourteenth implementations, the adjacent area 42 is a pair of adjacent areas 42 sandwiching the mesa stripe structure 16.

The example implementations described above are not limited and different variations are possible. The structures explained in the example implementations may be replaced with substantially the same structures and other structures that can achieve the same effect or the same objective.

The foregoing disclosure provides illustration and description, but may be not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations may include each dependent claim in combination with every other claim in the claim set. As used herein, a phrase referring to "at least one of" a list of items refers to any combination of those items, including single members. As an example, "at least one of: a, b, or c" may be intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" may be intended to include one or more items referenced in connection with the article "the" and may be used interchangeably with "the one or more." Furthermore, as used herein, the term "set" may be intended to include one or more items (e.g., related items, unrelated items, or a combination of related and unrelated items), and may be used interchangeably with "one or more." Where only one item may be intended, the phrase "only one" or similar language may be used. Also, as used herein, the terms "has," "have," "having," or the like are intended to be open-ended terms. Further, the phrase "based on" may be intended to mean "based, at least in part, on" unless explicitly stated otherwise. Also, as used herein, the term "or" may be intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

The invention claimed is:

1. A semiconductor optical integrated device comprising:
    a mesa stripe structure in a stripe shape extending in a first direction, the mesa stripe structure having a first portion and a second portion spaced apart and arranged in the first direction, the mesa stripe structure having a third portion between the first portion and the second portion, the mesa stripe structure comprising a semiconductor; and
    an electrode pattern including a first electrode that overlaps with the first portion but does not overlap with the second portion, the electrode pattern including a second electrode that overlaps with the second portion but does not overlap with the first portion, the first electrode and the second electrode being separated, the electrode pattern comprising a metal in a shape of not overlapping with the third portion,
    the electrode pattern including:
        a third electrode that is separated from the first electrode and the second electrode,
            wherein the third electrode is not electrically connected to the mesa stripe structure, and
            wherein the third electrode is configured to relieve unevenness of stress on the mesa stripe structure; and
        an adjacent area, that is part of the third electrode, not overlapping with the mesa stripe structure, the adjacent area being next to the third portion in a second direction orthogonal to the first direction, the adjacent area being on a semiconductor layer continuous to the mesa stripe structure.

2. The semiconductor optical integrated device according to claim 1, wherein the semiconductor layer is in contact with a side of the mesa stripe structure.

3. The semiconductor optical integrated device according to claim 1, wherein the third electrode is a right-side electrode and a left-side electrode sandwiching the mesa stripe structure in the second direction.

4. The semiconductor optical integrated device according to claim 3, wherein the right-side electrode and the left-side electrode are equal in planar size.

5. The semiconductor optical integrated device according to claim 1, wherein the third electrode is next, in the second direction, to at least part of the first electrode and at least part of the second electrode.

6. The semiconductor optical integrated device according to claim 5, wherein the third electrode is next, in the second direction, to the entire first electrode and the entire second electrode.

7. The semiconductor optical integrated device according to claim 1, wherein the adjacent area is a pair of adjacent areas sandwiching the mesa stripe structure.

8. The semiconductor optical integrated device according to claim 1, wherein the separation of the first electrode and the second electrode is based on being configured to be electrically insulated from each other.

9. The semiconductor optical integrated device according to claim 1, wherein the third electrode is separated from the first electrode and the second electrode based on the third electrode being configured to be electrically insulated from the first electrode and the second electrode.

10. The semiconductor optical integrated device according to claim 1, wherein the adjacent area is configured to sandwich the mesa stripe structure.

11. The semiconductor optical integrated device according to claim 1, wherein the adjacent area is configured to sandwich the mesa stripe structure below the electrode pattern.

12. A device comprising:

a mesa stripe structure in a stripe shape extending in a first direction, the mesa stripe structure having a first portion and a second portion spaced apart and arranged in the first direction, the mesa stripe structure having a third portion between the first portion and the second portion, the mesa stripe structure comprising a semiconductor; and an electrode pattern including a first electrode that overlaps with the first portion but does not overlap with the second portion, the electrode pattern including a second electrode that overlaps with the second portion but does not overlap with the first portion, the first electrode and the second electrode being separated, the electrode pattern comprising a metal in a shape of not overlapping with the third portion, the electrode pattern including:

a third electrode that is separated from the first electrode and the second electrode, wherein the third electrode is not electrically connected to the mesa stripe structure, and wherein the third electrode is configured to relieve unevenness of stress on the mesa stripe structure; and an adjacent area, that is part of the third electrode, not overlapping with the mesa stripe structure, the adjacent area being next to the third portion in a second direction orthogonal to the first direction, the adjacent area being on a semiconductor layer continuous to the mesa stripe structure.

13. The device of claim 12, wherein the third electrode is a right-side electrode and a left-side electrode sandwiching the mesa stripe structure in the second direction.

14. The device of claim 13, wherein the right-side electrode and the left-side electrode are equal in planar size.

15. The device of claim 12, wherein the adjacent area is configured to sandwich the mesa stripe structure.

16. A method, comprising:

operating an optical integrated device, wherein the optical integrated device comprises:

a mesa stripe structure in a stripe shape extending in a first direction, the mesa stripe structure having a first portion and a second portion spaced apart and arranged in the first direction, the mesa stripe structure having a third portion between the first portion and the second portion, the mesa stripe structure comprising a semiconductor; and an electrode pattern including a first electrode that overlaps with the first portion but does not overlap with the second portion, the electrode pattern including a second electrode that overlaps with the second portion but does not overlap with the first portion, the first electrode and the second electrode being separated, the electrode pattern comprising a metal in a shape of not overlapping with the third portion, the electrode pattern including:

a third electrode that is separated from the first electrode and the second electrode, wherein the third electrode is not electrically connected to the mesa stripe structure, and wherein the third electrode is configured to relieve unevenness of stress on the mesa stripe structure; and an adjacent area, that is part of the third electrode, not overlapping with the mesa stripe structure, the adjacent area being next to the third portion in a second direction orthogonal to the first direction, the adjacent area being on a semiconductor layer continuous to the mesa stripe structure.

17. The method of claim 16, wherein the third electrode is a right-side electrode and a left-side electrode sandwiching the mesa stripe structure in the second direction.

18. The method of claim 17, wherein the right-side electrode and the left-side electrode are equal in planar size.

19. The method of claim 16, wherein the adjacent area is configured to sandwich the mesa stripe structure.

20. The method of claim 16, wherein the separation of the first electrode and the second electrode is based on being configured to be electrically insulated from each other.

* * * * *